United States Patent [19]

Morgan

[11] 3,868,281

[45] Feb. 25, 1975

[54] LUMINESCENT DEVICE AND METHOD THEREFOR

[75] Inventor: Thomas Nolen Morgan, Carmel, N.Y.

[73] Assignee: International Business Machines Corporation, Armonk, N.Y.

[22] Filed: May 24, 1973

[21] Appl. No.: 363,679

Related U.S. Application Data

[63] Continuation-in-part of Ser. No. 742,817, July 5, 1968, abandoned.

[52] U.S. Cl. ...................... 148/190, 357/17, 357/63

[51] Int. Cl. ........................................ H05b 33/00

[58] Field of Search ................ 317/235 N, 235 AQ; 313/108 D; 357/17, 63; 148/190

[56] References Cited

OTHER PUBLICATIONS

*Journal of Applied Physics*, "Evidence for Radiative Recombination between Deep-Acceptor Pairs . . ." by Gershenzon et al., Feb. 1966, pages 483–486.

*Primary Examiner*—Martin H. Edlow
*Attorney, Agent, or Firm*—Bernard N. Wiener

[57] ABSTRACT

The practice of the disclosure achieves control of the quantum efficiency of emitted recombination radiation from solid-state semiconductor luminescent devices. Generally, the quantum efficiency for conversion of recombination energy to recombination radiation is selectively increased or decreased for a luminescent device. This is accomplished by incorporating in the device a deep level impurity of one conductivity type and two shallow level impurities of opposite conductivity type. Particularly, the control involves selective doping of acceptor impurities to increase or decrease the relative proportions of radiative and non-radiative physical processes. Illustratively, the efficiency is increased at a given temperature by doping with acceptor impurity cadmium, an electroluminescent GaP diode normally doped with donor impurity oxygen and acceptor impurity zinc, and by compensating the Zn atoms which are not paired with O atoms by doping the solid with a shallow level donor, e.g., S. By doping the diode with acceptor impurities zinc anc carbon, the efficiency of emitted recombination radiation is decreased at a given temperature.

2 Claims, 9 Drawing Figures

INCREASED INTENSITY

DECREASED INTENSITY

INVENTOR
THOMAS N. MORGAN
BY Bernard N. Wiener
ATTORNEY

LUMINESCENT DEVICE AND METHOD THEREFOR

This is a continuation-in-part of copending application Ser. No. 742,817 filed July 5, 1968, now abandoned.

BACKGROUND OF THE INVENTION

This invention relates generally to luminescent solid-state devices and method therefor, and it relates more particularly to a semiconductor luminescent device with predetermined efficiency of emitted recombination radiation at a given temperature and method for selectively doping the device to achieve the efficiency.

The quantum efficiency of a luminescent device is defined as the ratio of the number of photons of the desired energy range emitted divided by the number of electron-hole pairs which were generated. The external efficiency of a luminescent device depends on the total number of photons which escape from the device. This efficiency is reduced below the internal efficiency by absorption and other losses of photons within the device. For a given device structure and comparable operating and measuring conditions, the intensity of emitted recombination radiation is a convenient comparable parameter for different luminescent devices. In this disclosure, the terminology of intensity of emitted recombination radiation is conveniently used with reference to the comparative characteristic of a single device; and the terminology of efficiency of emitted recombination radiation is conveniently used with reference to the comparative characteristics of several different devices. Both terminologies will be used herein to characterize the practice of the invention.

The efficiency of recombination radiation from a luminescent device relates to the number of emitted photons for a given number of available electron-hole pairs which have been created by absorption of equivalent energy. The energy may be absorbed from injected quanta or electrons. The electrons may be injected either mechanically or electrically. Electrons are injected mechanically when their source is external to the luminescent device. Electrons are injected electrically when their source is internal to the device, i.e., there is an electron injecting contact such as a p-n junction present for the device. A luminescent solid-state device usually has intensity of emitted recombination radiation which approaches the theoretical maximum at low temperature, e.g., 4°K, liquid helium temperature, and falls off to a small percentage thereof at room temperature, e.g., 300°K. The source of the decrease in intensity of emitted recombination radiation with increase in temperature has been previously determined to be the conversion of recombination energy to other internal energy in the device.

Recombination radiation is emitted from a solid-state device when an isolated electron recombines with an isolated hole to translate the released energy into a photon of electromagnetic energy. The source of electrons is the conduction band and the source of holes is the valence band. Isolated electrons and holes are established in the solid at impurity levels due to donors and acceptors. The source of energy for establishing the isolated electrons and holes may be a voltage source for a semiconductor p-n junction device and may be electromagnetic radiation or energetic electrons for a bulk semiconductor device.

It is desirable for a luminescent solid-state device which emits recombination radiation to have a controllable efficiency of emitted radiation at different temperatures. It is also desirable in one instance that the efficiency of emitted recombination radiation be greater than normally occurs at the temperature of interest; and in another instance that the efficiency be smaller. Further, it is desirable that such a solid state electroluminescent device be easily fabricated from readily available material.

GaP light-producing (luminescent) diodes doped with zinc and oxygen or with cadmium and oxygen are known in the prior art. It is further known how to minimize the free carrier absorption by minimizing the number of available holes in the valence band. However, there is no teaching in the prior art of the use of a second acceptor such as cadmium in combination with the zinc and oxygen pairs to decrease "Auger" recombination or use of a second acceptor such as carbon in combination with the zinc to increase Auger recombination. An illustrative background text is *Luminescence of Inorganic Solids*, edited by P. Goldberg, Academic Press, 1966.

OBJECTS OF THE INVENTION

It is an object of this invention to provide a luminescent solid-state device with a predetermined efficiency of emitted recombination radiation at a given temperature.

It is another object of this invention to provide a method for easily fabricating the foregoing luminescent device from readily available materials.

It is another object of the invention to provide a luminescent solid-state device and method therefor in which competing physical processes are controllably changed to change the efficiency of emitted recombination radiation.

It is another object of this invention to provide the foregoing device and method with competing physical processes one of which is conversion of recombination energy to recombination radiation and another which is conversion of recombination energy to internal energy in the solid.

It is another object of this invention to carry out the foregoing object thereof by doping the solid-state device with a deep level impurity of one conductivity type and with two shallow level impurities of opposite conductivity type.

It is another object of this invention to carry out the foregoing object thereof for changing the intensity of emitted recombination radiation at a given temperature by introducing a deep level donor impurity into the luminescent solid and two acceptor impurities therein of different energy levels.

It is another object of this invention to achieve the foregoing object thereof for changing the intensity of emitted recombination radiation by introducing into the luminescent solid one acceptor impurity which controls the conversion of recombination energy into recombination radiation and another acceptor impurity which controls the conversion of recombination energy into internal energy in the solid.

It is another object of this invention to achieve the foregoing object thereof for increasing the intensity of the emitted recombination radiation from the luminescent solid at the given temperature by introducing a deeper acceptor impurity; and for decreasing the intensity of the emitted recombination radiation from the luminescent solid at the given temperature by introducing a shallower level acceptor impurity.

SUMMARY OF THE INVENTION

The invention relates to a crystal which possesses an excited state which can decay with the emission of light. An example of such a system is an insulator or semiconductor containing one or more electron-hole pairs, excited atoms or molecules, or other forms of excitation. In the emission process, this excitation energy is given to one or more photons which are then emitted and produce external radiation. In competition with this radiative process, there are one or more nonradiative processes by which the excitation energy is transferred to some form of energy other than light. In the practice of this invention, the mechanism by which the energy is transferred nonradiatively involves an electron or a hole in some state in the crystal which can in turn become excited to a higher energy state, thus carrying off the energy of excitation. The practice of this invention utilizes a mechanism whereby the number of electrons or holes which can participate in the nonradiative mechanism is controllably reduced or increased.

The process by which free holes produce nonradiative recombination is through the so-called Auger recombination mechanism. In this process, the recombination energy available from the bound electron and hole is transferred to a third particle, i.e., a free hole. The result of the mechanism is that the third particle is excited into a high energy state, thus carrying off the recombination energy which is then dissipated through interaction with the lattice.

The Auger recombination mechanism can operate either with a free hole or a free electron as the third particle. In GaP material containing deep acceptors and shallow donors which contribute to radiative recombination, introduction of a deeper donor together with compensation by shallow acceptors can increase the radiative efficiency while introduction of shallow donors can reduce the efficiency.

The practice of this invention involves optimizing the number of zinc-oxygen pairs, minimizing the number of upaired zinc atoms, and optimizing the number of deeper level cadmium atoms, and compensating any unpaired zinc atoms which remain. The role of the cadmium is to store the holes which were originally on the zinc acceptors and to reduce the number of holes stored on the zinc. A certain density of donors must be introduced to compensate with holes introduced by the zinc acceptors. As a result of the reduction in the density of holes stored on the zinc, the number of free holes excited into the valence band at room temperature is reduced. For the example of carbon to reduce the efficiency of emitted recombination radiation, the shallower level introduced by carbon between the zinc level and the edge of the valence band increases the number of holes available for thermal excitation into the valence band. In addition, the nearness of these levels to the valence band causes the holes to be released at a lower temperature. Consequently, the Auger recombination mechanism operates more effectively and reduces the intensity of emitted recombination radiation.

In the practice of this invention a luminescent solid state device is fabricated to have a deep level donor impurity level and two acceptor impurity levels of different energies. By controlling the relative concentrations of the two acceptor impurities, the intensity of emitted recombination radiation is controllably changed. An increase in the intensity of emitted recombination radiation is achieved by increasing the relative concentration of the deeper level acceptor impurity. The emitted recombination radiation is primarily from zinc-oxygen pairs. A shallow level donor impurity, e.g., S, Se, Te, or Si, is introduced to compensate unpaired zinc atoms and achieve the desired reduction in free hole concentration, i.e., number of free holes at the edge of the valence band. A decrease in the intensity of emitted recombination radiation is achieved by increasing the relative concentration of the shallower level acceptor impurity.

The foregoing and other objects, features, and advantages of the invention will be apparent from the following more particular description of preferred embodiments of the invention, as illustrated in the accompanying drawings.

BRIEF DESCRIPTION OF THE DRAWING

FIG. 4 is a schematic diagram of apparatus suitable for growing a doped electroluminescent device according to the practice of this invention of which

PREFERRED EMBODIMENTS OF THE INVENTION

The preferred embodiments of this invention include a crystal of GaP. The deep level donor impurity is oxygen. For a luminescent device of GaP in which the intensity of emitted recombination radiation is increased relative to that normally occurring at room temperature, the acceptor impurities are Cd and Zn for the deeper level and shallower level acceptor impurities, respectively, and the compensating shallow donor impurity is Si. For a luminescent device of GaP in which the intensity of emitted recombination radiation is decreased relative to that normally occurring at room temperature, there are acceptor impurities Zn and C for the deeper energy level and shallower energy level, respectively.

This invention provides high-efficiency luminescent devices and electroluminescent diodes and is concerned with the preparation of such devices in such a way that Auger nonradiative transitions are eliminated insofar as possible. The existence of this type of transition is a major cause of loss in such devices. In an illustrative electroluminescent diode of GaP, there is doping of the P region of the diode not only with the donor impurity oxygen and the acceptor impurity zinc, but also with cadmium which is a deeper acceptor impurity, and the compensating donor impurity is Si. In this device the zinc concentration is not higher than that necessary to produce the desired recombination energy (zinc and oxygen pairs); and the deeper lying cadmium acceptor impurity and compensating shallow silicon donor impurity are used to ensure that there are few holes in the valence band.

In an Auger transition the recombination of electron-hole pairs, rather than emitting radiation, releases energy which is transmitted directly to another hole or electron which is excited to a higher energy state in either the valence or the conduction band. The most usual mechanism is the transfer of a hole to a higher energy state in the valence band after which the hole returns to a lower energy state by giving up energy in the form of lattice vibrations or phonons. A second dopant is used to provide a deeper level of p-type impurity which is not involved in the radiative recombination process but gives the desired control of the free hole concentration in the p-type material. A luminescent material is produced through the practice of this invention in which there is little transfer of holes from the impurity level to the valence band by thermal agitation at the temperature of operation and in which the compensation can be so exact, that there are few excess holes in the valence band.

Figure 1A:
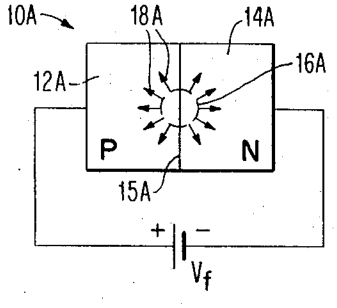
FIG. 1A PRIOR ART
FIG. 1A is a schematic diagram of an exemplary prior art electroluminescent diode doped with the donor impurity oxygen and with the acceptor impurity zinc which has the normally occurring intensity of emitted recombination radiation at room temperature.
Figure 1B:
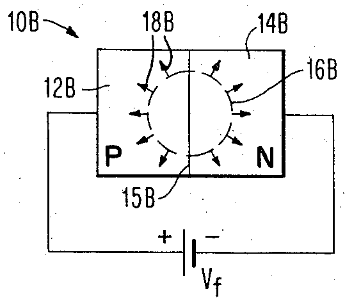
FIG. 1B is a schematic diagram of an electroluminescent GaP diode doped with the donor impurity oxygen, with a compensating donor, and with the acceptor impurities cadmium and zinc which has an increased intensity of emitted recombination radiation relative to that normally occurring at room temperature.
Figure 1C:
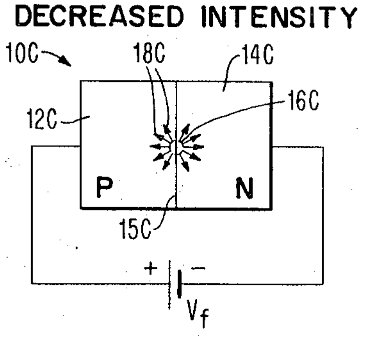
FIG. 1C is a schematic diagram of an electroluminescent GaP diode doped with donor impurity oxygen and with the acceptor impurities zinc and carbon which has a decreased intensity of emitted recombination radiation relative to that normally occurring at room temperature.

FIG. 1 presents schematic diagrams of comparable electroluminescent devices according to the prior art and according to the practice of this invention. The device of the prior art is presented in FIG. 1A. The device of this invention with increased intensity of emitted recombination radiation is presented in FIG. 1B. The device of this invention with decreased intensity of recombination radiation is presented in FIG. 1C.

FIG. 1A illustrates the generation of recombination radiation at p-n junction of a forward biased semiconductor element. A semiconductor element 10A has p-type region 12A and an n-type region 14A, with a p-n junction 15A therebetween. The positive terminal of a potential source $V_f$ is shown connected to the p-type region 12A and its negative terminal is shown connected to the n-type region 14A, thereby forward biasing semiconductor element 10A. An illustrative region 16A of the p-n junction is shown in circular form. Emanating from region 16A is light 18A, represented by arrows. An illustrative device for FIG. 1A is an electroluminescent diode of GaP doped with donor impurity oxygen and acceptor impurity zinc.

By including acceptor impurity cadmium with acceptor impurity zinc according to the practice of this invention, the intensity of recombination 18B from the device 10b 10B FIG. 1B is increased relative to the intensity of recombination radiation from the prior art device 10A of FIG. 1A at a given temperature. In addition, a shallow level donor impurity, e.g., S, Se, Te, or Si, is included for the purpose of compensating some of the holes contributed by the zinc.

By including acceptor impurity carbon with acceptor inpurity zinc according to the practice of this invention, the intensity of recombination radiation 18C from the device 10C of FIG. 1C is decreased relative to the intensity of recombination radiation 18A from the device 10A of FIG. 1A.

Figure 2A:
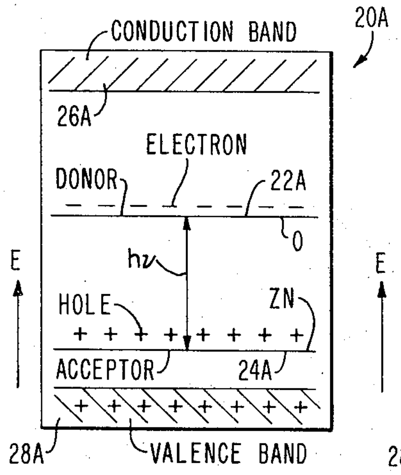
FIG. 2A is a line diagram of the conduction band, valence band and impurity levels for a GaP electroluminescent diode doped with donor impurity oxygen and acceptor impurity zinc illustrating the problem of the prior art practice.
Figure 2B:
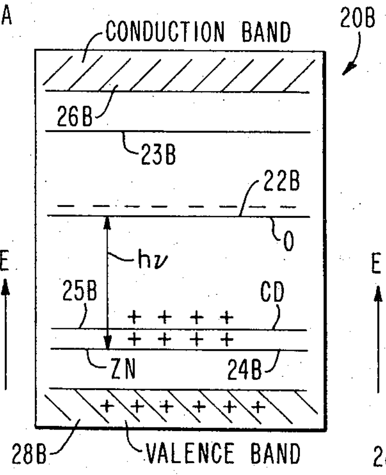
FIG. 2B is a line diagram similar to that of FIG. 2A, but including acceptor impurity Cd and compensating donor impurity Si for increasing the intensity of emitted recombination radiation.
Figure 2C:
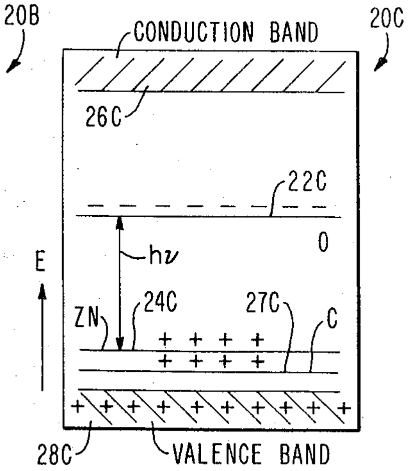
FIG. 2C is a line diagram similar to that of FIG. 2 but including acceptor impurity C for decreasing the intensity of emitted recombination radiation.

The nature and operation of a luminescent solid-state device in accordance with the practice of this invention will now be described particularly with reference to FIGS. 2 and 3. FIG. 2 includes FIGS. 2A, 2B, and 2C which respectively are line diagrams of the band structures of luminescent devices according to the prior art, according to the practice of this invention for increased intensity of recombination radiation at a given temperature, and according to the practice of this invention for decreased intensity of emitted recombination radiation at a given temperature.

Generally, FIG. 2A represents the band structure for a semiconductor crystal of GaP doped with donor impurity oxygen and acceptor impurity zinc. The donor impurity O provides a deep donor level 22A; and the acceptor impurity Zn provides a shallow acceptor level 24A in relationship to the conduction band 26A and valence band 28A, respectively.

By a suitable physical process, e.g., an internal electric field for a p-n electroluminescent diode, photon absorption for a photoluminescent device, and electron bombardment for a cathodoluminescent device, electrons are established at the donor level 22A and holes are established at the acceptor level 24A. The potential energy difference between an electron at the donor level 22A and a hole at the acceptor level 24A is termed the recombination energy thereof. This recombination energy is converted into either a photon of recombination radiation, i.e., hν of comparable energy, through a radiative transition or is converted into internal energy of the crystal 20A through a nonradiative transition. The predominant mechanism by which the recombination energy is translated into internal energy by a nonradiative transition is termed the Auger mechanism. Essentially, for the Auger mechanism, a hole close to the band edge in the valence band absorbs the recombination energy between an electron at the donor level 22A and a hole at the acceptor level 24A and a comparable hole appears deeper in the valence band at the depth of the absorbed energy. Because the donor level 22A is established as a deep level through a deep donor impurity oxygen, there is a higher concentration of holes in the valence band to absorb the energy of recombination than there is of electrons at the edge of the conduction band to absorb the recombination energy.

In a GaP crystal doped with donor impurity oxygen and acceptor impurity zinc, the O occurs largely as Zn-O pairs in the crystal which contribute mainly to the recombination centers which store the recombination energy available for radiative and nonradiative transitions. The total number of holes at the band edge of the valence band 28A which are available for participation in the Auger mechanism is determined by the total number of Zn dopant atoms minus the compensating donors in the crystal. Of the total number of Zn dopant atoms in the crystal, only a small proportion are located close to and are paired with the O atoms.

Figure 3:
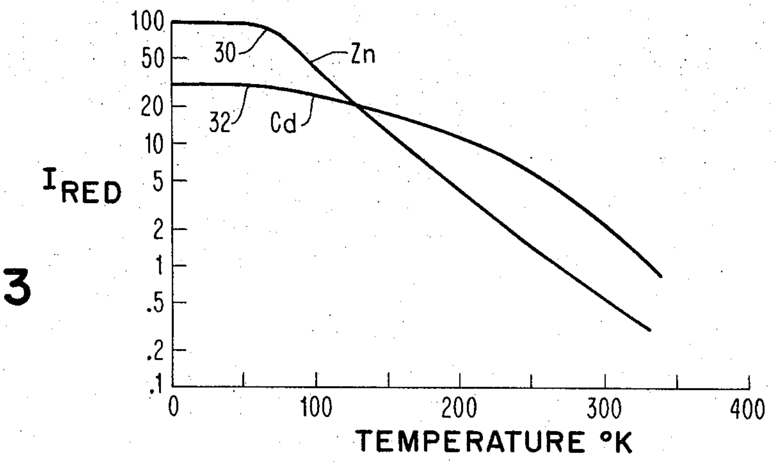
FIG. 3 is a graphical representation of the intensity of emitted red recombination radiation from an electroluminescent GaP diode plotted against the increase of absolute temperature for donor impurity zinc and, as an example, with acceptor impurity cadmium.

With reference to FIG. 3, there is presented an idealized plot of $I_{RED}$ which is the intensity of emitted radiation on an arbitrary scale, i.e., the intensity of red recombination radiation emitted from a luminescent device of GaP, where the maximum value for zinc dopant at 4°K is specified as 1.0. The curves for Zn and for Cd doping are for the same general operational conditions of the related devices. On the horizontal scale of FIG. 3, there is the absolute temperature T. It is observed from inspection of FIG. 3 that a luminescent device of GaP of the nature illustrated in FIGS. 1A and 2A of the prior art doped mainly with Zn atoms to establish acceptor level 24A has a small intensity of the order of 0.1 $I_{RED}$ at 300°K and has approximately the maximum value of 1.0 $I_{RED}$ at liquid helium temperature of 4°K. It is observed in FIG. 3 that the curve 32 for Cd has a higher value of $I_{RED}$ at 300°K and a lower value at 4°K than the comparable curve 30 for the Zn.

Through the practice of this invention, a luminescent device of GaP is provided which has either an increased intensity of emitted recombination radiation or a decreased intensity of emitted recombination radiation dependent upon whether the crystal is additionally doped with acceptor impurity Cd or acceptor impurity C. The acceptor impurity Cd enters the crystalline lattice of GaP at relatively remote locations from the oxygen atoms which participate in the recombination energy transition. The nature of the band structure for a semiconductor crystal of GaP doped with donor impurity oxygen and acceptor impurities zinc and cadmium is illustrated in FIG. 2B. A compensating shallow level donor impurity is included in the GaP crystal whose energy level 23B is illustrated in FIG. 2B. The excess zinc atoms over those paired with oxygen are desirably compensated by shallow level donor atoms, e.g., S, Se, Te, or Si. A significant proportion of the holes which were established at the acceptor level for Zn are now shared with the cadmium level 25B. As nearly the total number of holes from the Zn level participate at 300°K in the Auger mechanism for conversion of recombination energy into internal energy of the solid by nonradiative transitions, by storing a significant number of the holes which would have been stored at the Zn level at the Cd level, the proportion of the emitted recombination radiation is increased.

Further, as is illustrated in FIG. 2C by introducing an impurity level due to acceptor impurity carbon between the impurity level for Zn and the edge of the valence band, there is an increased probability for the Auger mechanism to occur, since the relative number of holes in acceptor levels proximate to the edge of the valence band has effectively been increased.

Figure 4A:
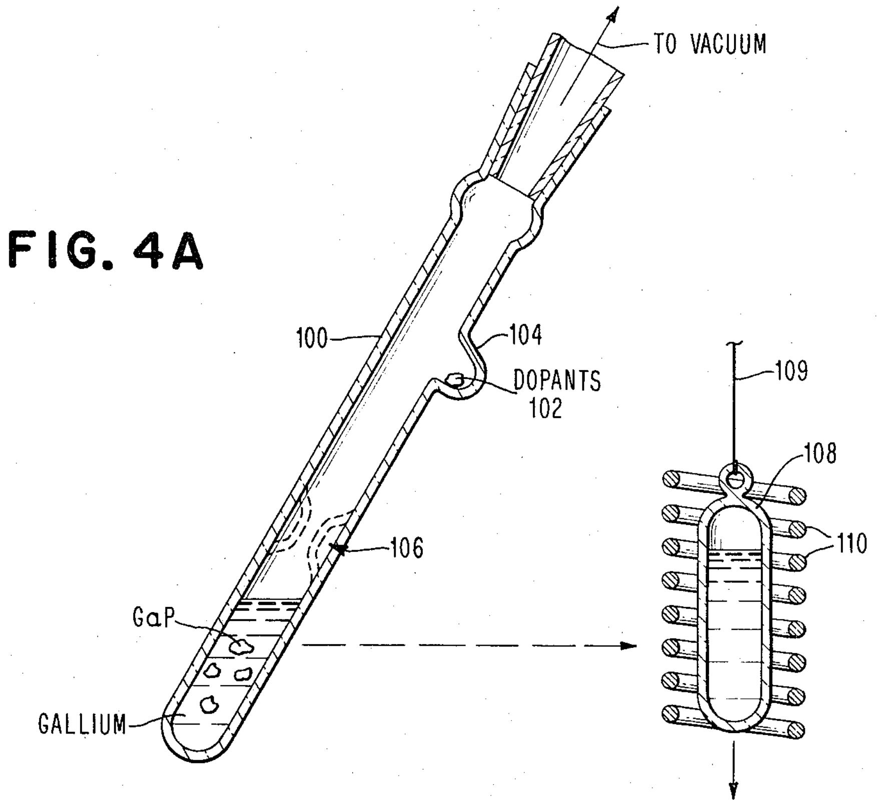
FIG. 4A illustrates growth of GaP crystal platelets by solution growth technique and FIG. 4B illustrates growth of p-n junctions in GaP solution regrowth technique.

The crystals of GaP for practice of this invention can be grown through use of conventional techniques. Illustratively, a technique for solution growth of GaP platelets from gallium solutions is described in the article by L. M. Foster et al in the *IBM Journal of Research and Development*, Vol. 10, March 1966, pages 114 to 121. Apparatus as presented in FIG. 4A is suitable for using the solution growth technique. FIG. 4 depicts apparatus for growing crystals of GaP containing the desired n-type dopants. In the technique which FIG. 4A represents, GaP is dissolved in Ga, the desired impurities are added, and the solution is cooled from a high temperature. During the cooling, platelets of GaP containing the desired impurities are formed. A Ga-GaP composition is chosen to given an adequate yield of crystals at a temperature not yet high enough to cause excessive attack on the quartz container 100. A convenient temperature range is 1,100°–1,125°C, where the GaP solubility is 10–12 percent (weight).

The outgassing of the system is accomplished by flaming the quartz container tube 100 shown in FIG. 4A under vacuum prior to addition of the dopants 102 to the solution. The dopants 102 are contained in the depression near the top of the tube during the outgassing so they are not lost by volatilization and later are added to the melt by rotating the tube about the greased joint. The tube is then sealed at the constriction shown as 106.

The sealed capsule 108 is then supported by support 109 in a vertical-tube furnace 10 at a temperature about 10°–20° above the saturation solubility temperature for the particular mixture and held at that temperature for about 2 hours to ensure complete solution of the GaP. It is then lowered out of the furnace with a lowering time of 40 minutes being typical. The GaP crystals can be recovered from the excess gallium by boiling them in 1:3 HCl — $H_2O$. The material grown by this process can then be used in three ways. First, it can be used in a photoluminescent device as grown or after appropriate conventional heat treatment. Second, it can be used similarly in cathodoluminescent devices, again after appropriate conventional heat treatment, if necessary. Finally, the crystals grown by this process may be used in the fabrication of p-n junctions by conventional technique. Illustratively, alloy contacts may be formed on the surface of a platelet in such a way as to produce a p-n junction; or the platelets grown as described with reference to FIG. 4A may be used in the apparatus of FIG. 4B as substrates upon which GaP of the opposite conductivity type (n or p) is overgrown epitaxially on the substrate.

Figure 4B:
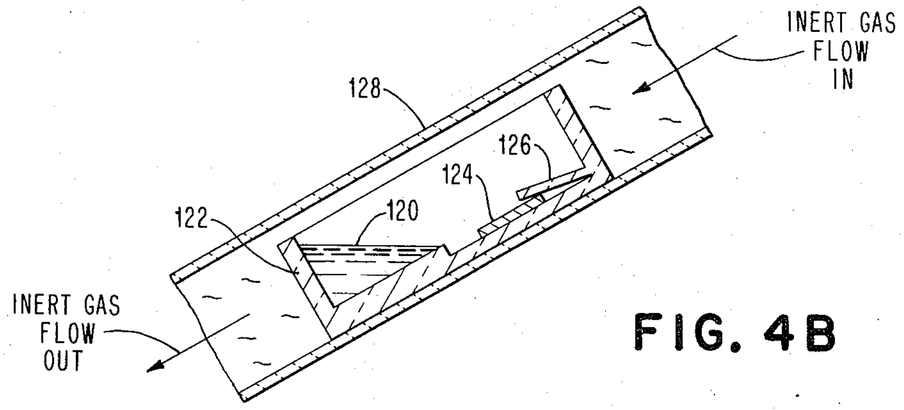

The technique of solution overgrowth is described in the article by H. Nelson, *RCA Review*, December 1961, pages 603 et seq. With reference to FIG. 4B, in the overgrowth technique, the desired impurities are dissolved together with GaP in a Ga solution 120 in boat 122. Platelet 124 is supported in boat 122 by spring 126 in the presence of an inert gas, e.g., He. When the solution 120 has reached the desired temperature in furnace 128, the boat 122 containing the substrate platelet and the Ga solution is tipped so that the Ga covers the substrate 124. The furnace 128 is then cooled, and the GaP containing the impurities deposits epitaxially on the platelet substrate 124.

THEORY OF INVENTION

In luminescence produced by recombination of trapped electrons and holes in semiconductors, a common cause of nonradiative energy loss at high temperatures is a process whose rate is proportional to the density of free electrons or holes released by thermal excitation. The dependence of free carrier densities on sample parameters is well known. Experimentally, for Zn-O doping, there is a photoluminescent efficiency of $\approx (1 + 2 \cdot 10^{-16} p)^{-1}$, where the free hole concentration $p$ is in $cm^{-3}$.

The practice of this invention applies to luminescent devices in which light is produced during recombination of electrons and holes in bound states, i.e., "pair" recombination. For devices of high quantum efficiency at high temperatures, the densities of all holes and electrons which do not contribute to the desired radiative recombination must be kept low. Several parameters can be adjusted to reduce the free carrier density:

a. The binding energies $E_b$ of the impurity states should be large compared to $kT$, i.e., $exp\ (E_b/kT) >> 1$.

b. Nearly equal densities of donors and acceptors should be introduced, i.e., $N_A - N_D << (N_A + N_D)$. The following are factors of interest:

a. Deep impurities produce relatively low photon energies.

b. Large impurity densities make compensation difficult and may produce "concentration quenching" of the luminescence.

c. In closely compensated material the low density of bound majority carriers may allow other nonradiative processes to compete successfully with radiative pair recombination.

Illustratively, in p-type GaP containing O donors.

a. when Cd is partially substituted for the Zn acceptors, it provides a mechanism for control of the effectiveness of the compensation. When Cd totally replaces the Zn acceptors, the radiative efficiency at high temperature is increased; but the emission peak is shifted by approximately 0.033 e.v. to lower energy. When Cd and Zn acceptors are present in approximately equal concentrations, the peak of the emission energy falls between the two peaks for Zn-O and Cd-O emission. Advantage can be taken of the higher diffusion rate of Zn relative to that of Cd. Thus, by annealing, the concentration of Zn-O pairs may be enhanced relative to the Cd-O pairs and the energy of the emitted recombination radiation increased without sacrificing the higher efficiency associated with the deeper Cd acceptor level.

b. High densities of the impurities are less important than close compensation and are limited by the solubility of the O donors.

c. For either Cd or Zn doping, the acceptor density should be kept low. The shallow donor density should be kept low to eliminate any competing processes through such centers. A formula for efficient luminescence in p-type GaP (eff.>50 percent) is as follows: Dope the material heavily with oxygen, e.g., $N_D = 10^{17}$ $cm^{-3}$, and control the acceptor doping carefully to give $N_A < N_D + 5.10^{15}$ $cm^{-3}$.

PRACTICE OF THE INVENTION

It is known in the prior art, as shown by the article in The Physical Review, Vol. 166, No. 3, pages 751–753, Feb. 15, 1968, by T. N. Morgan et al., that the red radiation from a GaP crystal doped with zinc and oxygen will be due to zinc only if there are nearest neighbor pairs of zinc and oxygen, and that the similar radiation from a GaP crystal doped with cadmium and oxygen will be due to cadmium only if there are nearest neighbor pairs of cadmium and oxygen. The nearest neighbor pairs of atoms occupy adjacent lattice sites. In contrast, in accordance with the practice of the present invention, the zinc and oxygen are predominantly paired and control the radiative transitions, and the cadmium is predominantly isolated from oxygen and controls the nonradiative transitions.

In the prior art, the article by Gershenzon et al Journal of Applied Physics, pages 483–486, Vol. 37, No. 2, February 1966, discloses a GaP crystal with Zn and Cd dopant impurities therein which produces output photon radiation as result of input photon radiation. Gershenzon et al show two separate peaks of output photon energy of comparable intensity for Zn-O and Cd-O. For Zn and Cd dopant impurities in GaP crystal of Gershenzon et al., the energy of the output radiation is the sum of the output radiations from Zn-O pairs and Cd-O pairs. Therefore, for Gershenzon et al both transitions Zn-O and the Cd-O control both the radiative transistions and the nonradiative transitions of the recombination energy. In contrast, in the practice of the present invention, the energy of the output radiation from a GaP crystal is essentially that for Zn-O associated pairs and a Cd-O peak is effectively absent. A device according to the present invention has effectively only a radiation intensity peak for zinc-oxygen pairs and the cadmium does not contribute substantially to the output radiation whereas the Gershenzon et al device has peaks of comparable intensity for zinc-oxygen pairs and for cadmium-oxygen pairs.

As shown by the article by S. M. Sze Press, al. in The Journal Solid State Electronics, Pergamon Prss, 1968, Vol. 11, pages 599–600, carbon is known in the prior art as a shallow level p-type dopant in III-V compounds. However, carbon is established in a special manner in a device according to the present invention for controlling nonradiative transitions. The use of carbon has an advantage not necessarily implicit for other shallow acceptor impurities. Carbon acceptor atoms occupy P sites in GaP and cannot form nearest neighbor pairs with oxygen donors which occupy similar sites. Therefore, carbon atoms in GaP with oxygen as the deep level donor impurity naturally contribute mainly to the nonradiative recombination transitions.

Further, the purpose of the carbon is to introduce a different acceptor level than the zinc in the GaP to increase nonradiative transitions of the recombination energy. Through the practice of the present invention a shallow acceptor level is introduced in the GaP to alter the efficiency of the luminescent device. The zinc and carbon introduced in GaP for the practice of the present invention produce different efficiencies in the operation of the luminescent device. Cadmium is used to increase the efficiency and carbon is used to decrease the efficiency.

The article in the Applied Physics Letters, Vol. 12, No. 4, Feb. 15, 1968, pages 115–117 by A. Onton et al provides exemplary prior art knowledge for time and temperature for the annealing step of the method of this invention. In accordance with the teaching of the noted article by A. Onton et al., annealing a sample of GaP for 10 minutes at 600°C is suitable practice for the annealing step of this invention. The noted article by A. Onton et al. in Applied Physics Letters provides a teaching of the dependence of radiative efficiency in GaP diodes on heat treatment for diodes which are of GaP doped with Zn. It discloses that a heat treatment at 900°C for 2 minutes broke up the pairs of zinc and oxygen thereby reducing the radiative efficiency which was due to these zinc-oxygen pairs. The subsequent annealing at 600°C caused the zinc to diffuse and to reform the pairs of zinc and oxygen which therefor increased the radiative efficiency.

Because of the high temperature used in growing GaP crystals as disclosed hereinbefore, e.g., 1,100°C–1,125°C, an unannealed sample which has been rapidly cooled necessarily contains few Zn-O or Cd-O pairs. Subsequent annealing of the GaP at 600°C for 10 minutes produces pairing of the Zn with O. Because of the much smaller diffusion rate of cadmium in gallium phosphide, the same heat treatment does not produce significant pairing of the cadmium with the oxygen. Therefore, because of the different diffusion rates of Zn and Cd in GaP, the disclosed annealing enhances the concentration of Zn-O pairs relative to the concentration of Cd-O pairs.

For preparation of a GaP device according to this invention where the GaP crystalline region has substantial numbers of cadmium-oxygen pairs and zinc-oxygen pairs present, the region is subjected to a high temperature, e.g., at 1,100°C for 10 minutes, to disassociate both Zn-O pairs and Cd-O pairs, then is rapidly cooled and then is annealed, e.g., at 600°C for 10 minutes, to enhance the concentration of Zn-O pairs with respect to the concentration of Cd-O pairs.

Preferably through annealing of the GaP, the number of Zn-O associated pairs is maximized and the number of Cd-O associated pairs is minimized relative thereto.

In order to get the red recombination radiation from gallium phosphide, the gallium phosphide is doped with zinc and oxygen. The recombination radiation from these two impurities occurs when the two impurities are paired into associates on adjacent lattice sites, i.e., nearest neighbor associates between one zinc and one oxygen. To maximize the number of Zn-O pairs, the maximum amount of oxygen is established in the GaP which is rather low, e.g., approximately in the range between $10^{16}$ and $10^{17}$ atoms per cubic cm. In order to pair all of the oxygen with zinc, there is introduced almost a factor of 10 more zinc than oxygen. Essentially the number of Zn-O pairs is equal to a constant times the zinc concentration times the oxygen concentration. Since the oxygen concentration is effectively fixed, the only variable is the zinc, which is why more zinc is used than oxygen.

After the maximum number of zinc-oxygen pairs is formed, the recombination process must be considered. An electron-hole pair in the vicinity of a zinc-oxygen pair, will recombine and give red light. However, if another hole is in the same vicinity of the zinc-oxygen pair, some energy that would normally go into radiation goes into hole energy and is termed a non-radiative transition. The energy that that hole carries off is lost in the form of heat rather than light which is usually undesirable. Extra holes are produced by the extra amount of zinc that is put in the GaP to form the zinc-oxygen pairs. Therefore, the number of extra holes must be reduced in order to minimize the non-radiative transitions. This is accomplished by adding another donor, e.g., S, which donates an electron which associates with the zinc and ionizes it to give $Zn^-$ ion. The hole is now trapped at the sulphur level. A hole which is trapped on a sulphur ion is not available either for radiative recombination or for inducing non-radiative transition. The holes needed for radiative recombination are supplied by the isolated cadmium, which, because of the greater depth of the levels they introduce into the band gap (relative to zinc), release only a small number of holes to the valence band. Since these holes are insufficient in number to induce non-radiative transitions, the efficiency of the device is increased. Thus, the cadmium controls the efficiency of the device.

While the invention has been particularly shown and described with reference to preferred embodiments thereof, it will be understood by those skilled in the art that the foregoing and other changes in form and details may be made therein without departing from the spirit and scope of the invention.

What is claimed is:

1. Method of controlling the efficiency of emitted recombination radiation from a luminescent device comprising a semiconductor GaP crystalline region having a deep level dopant impurity oxygen of one conductivity type in a concentration of approximately $10^{16}$ to $10^{17}$ atoms/cc$^3$ and being susceptible of storing recombination energy in electron-hole pairs, said device having substantially only one predominant peak of emitted recombination radiation corresponding to zinc-oxygen pairs of atoms comprising the steps of:

doping said crystalline region of said luminescent device with one shallow level dopant impurity zinc of opposite conductivity type in a concentration approximately 10 times said concentration of oxygen for controlling radiative transitions of said recombination energy;

doping said crystalline region of said luminescent device with another shallow level dopant impurity of said one conductivity type for compensating said one dopant impurity zinc of said opposite conductivity type, said another shallow level dopant impurity being selected from the group consisting of sulphur, selenium, tellurium and silicon;

doping said crystalline region of said luminescent device with another shallow level dopant impurity cadmium of said opposite conductivity type in a concentration approximately equal to said concentration of oxygen for controlling nonradiative transitions of said recombination energy;

heating said crystalline region to disassociate both zinc-oxygen pairs of atoms and cadmium-oxygen pairs of atoms in said crystalline region; and annealing said crystalline region to enhance the concentration of associated zinc-oxygen pairs of atoms therein relative to the concentration of associated cadmium-oxygen pairs of atoms therein;

whereby said output recombination from said luminescent device has said one predominant peak due to said associated zinc-oxygen pairs of atoms therein and has efficiency due to isolated cadmium atoms therein.

2. Method according to claim 1 wherein said heating of said device is at approximately 1,100°C for approximately 10 minutes, and said annealing of said device is at approximately 600°C for approximately 10 minutes.

* * * * *